(12) United States Patent
McCune, Jr.

(10) Patent No.: US 7,227,342 B2
(45) Date of Patent: *Jun. 5, 2007

(54) EXTREMELY HIGH-SPEED SWITCHMODE DC-DC CONVERTERS

(75) Inventor: Earl William McCune, Jr., Santa Clara, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/483,942

(22) Filed: Jul. 8, 2006

(65) Prior Publication Data

US 2006/0250118 A1   Nov. 9, 2006

Related U.S. Application Data

(63) Continuation of application No. 11/401,105, filed on Apr. 10, 2006, which is a continuation of application No. 10/394,949, filed on Mar. 21, 2003, now Pat. No. 7,026,797.

(51) Int. Cl.
G05F 1/613 (2006.01)

(52) U.S. Cl. ............... 323/225; 323/274; 323/284; 455/127.1

(58) Field of Classification Search .......... 323/22, 323/225, 273, 274, 283, 284, 288, 290; 455/127.1
See application file for complete search history.

(56) References Cited

U.S. PATENT DOCUMENTS

| | | | |
|---|---|---|---|
| 4,121,162 A | 10/1978 | Alberkrack et al. | |
| 4,484,153 A | 11/1984 | Borras et al. | |
| 4,660,182 A | 4/1987 | Bates et al. | |
| 6,218,891 B1 | 4/2001 | Lotfi et al. | |
| 6,768,146 B2 | 7/2004 | Yoshida | |
| 6,909,266 B2 * | 6/2005 | Kernahan et al. | 323/222 |

OTHER PUBLICATIONS

International Search Report for PCT/US2004/006353, filed on Nov. 4, 2004.

* cited by examiner

*Primary Examiner*—Jessica Han
(74) *Attorney, Agent, or Firm*—McDermott Will & Emery LLP (57) ABSTRACT

Switchmode DC-DC power converters using one or more non-Silicon-based switching transistors and a Silicon-based (e.g. CMOS) controller are disclosed. The non-Silicon-based switching transistors may comprise, but are not necessarily limited to, III–V compound semiconductor devices such as gallium arsenide (GaAs) metal-semiconductor field effect transistors (MESFETs) or heterostructure FETs such as high electron mobility transistors (HEMTs). According to an embodiment of the invention, the low figure of merit (FoM), $\tau_{FET}$, of the non-Silicon-based switching transistors allows the converters of the present invention to be employed in envelope tracking amplifier circuits of wireless devices designed for high-bandwidth technologies such as, for example, EDGE and UMTS, thereby improving the efficiency and battery saving capabilities of the wireless devices.

1 Claim, 11 Drawing Sheets

| Switching FET Dynamic FoM Comparison ||
|---|---|
| Switching Device Technology | tau-FET (ns) |
| Silicon NMOS | 0.08 |
| Silicon PMOS | 0.58 |
| GaAs MESFET | 0.0005 |
| GaAs pHEMT | 0.0002 |

EXTREMELY HIGH-SPEED SWITCHMODE DC-DC CONVERTERS

CROSS-REFERENCE TO RELATED APPLICATIONS

This is a continuation application of application Ser. No. 11/401,105, filed on Apr. 10, 2006 which is in turn a continuation of application Ser. No. 10/394,949, filed on Mar. 21, 2003 and issued as U.S. Pat. No. 7,026,797 on Apr. 11, 2006.

FIELD OF THE INVENTION

The present invention relates generally to power conversion. More particularly, the present invention relates to extremely high-speed switchmode DC-DC converters.

BACKGROUND OF THE INVENTION

Switchmode DC-DC power converters are commonly used in electronic devices. They operate by converting the voltage of an available voltage source to a voltage that complies with the voltage requirements of one or more components of the device. More particularly, switchmode DC-DC power converters operate to convert a direct current (DC) input voltage to a DC output voltage that is higher (boost converter) or lower (buck converter) than the DC input voltage. A common application of a buck converter is the conversion of an available voltage source in a personal computer (PC) to a voltage compatible with the voltage source requirements of devices and integrated circuits (e.g. the central processing unit (CPU)) on the motherboard of the PC.

Figure 1:
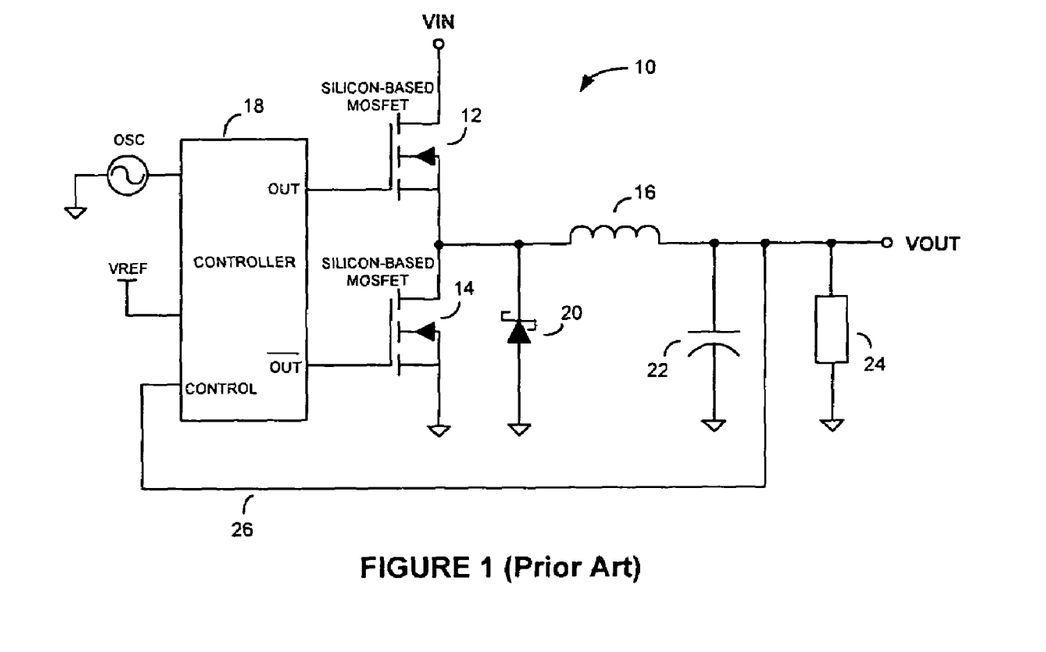
FIG. 1 is a schematic diagram of a conventional synchronous DC-DC buck converter.

A conventional DC-DC buck converter 10 is shown in FIG. 1. A first Silicon-based n-channel metal-oxide-semiconductor field effect transistor (MOSFET) 12, commonly referred to as the "high-side switch" of the converter 10 is coupled to a second Silicon-based MOSFET 14, which is referred to as the "low-side switch". Together, high-side switch 12 and low-side switch 14 control current flow through an inductor 16. During a charging phase of operation of converter 10, a controller 18 maintains high-side switch 12 in an ON condition and maintains low-side switch 14 in an OFF condition, thereby coupling a DC input voltage, VIN, to inductor 16. This charging phase energizes inductor 16, which stores energy in its magnetic field. Following the charging phase, converter 10 enters a discharging phase, during which time controller 18 maintains high-side switch 12 in an OFF condition and maintains low-side switch 14 in an ON condition, thereby decoupling VIN from inductor 16. During this discharging phase inductor 16 operates as a current source, supplying current from the energy stored in its magnetic field into capacitor 22 and load 24. Schottky diode 20 clamps any negative voltage from inductor 16 that may occur between the turn-OFF of switch 12 and the turn-ON of switch 14.

During the charging and discharging phases of operation of converter 10, current through inductor 16 rises and falls linearly, resulting in a triangular-shaped current signal. Capacitor 22 filters the inductor current so that the output voltage, VOUT, of converter 10 is essentially DC. It can be shown that the average value of VOUT over time is equal to the product of the duty cycle, D, of the high-side switch switching period and the value of VIN. By way of a feedback loop 26, VOUT is fed back to controller 18, which dynamically compares VOUT to a reference voltage VREF and modifies D depending on whether the value of VOUT is higher than the desired output voltage level or lower than the desired output voltage level.

In addition to switchmode power converters being of widespread use in the PC market, they are also prevalent in the wireless device industry. In this technology sector, switchmode power converters are used to not only provide efficient conversion for powering the baseband portion of the wireless device, but are also used to improve the efficiency of the power amplifier (PA) of the radio frequency (RF) transmitter portion of the wireless device. (The PA is usually the dominant power consumer of a wireless device.)

The PA of a wireless device is designed so that the battery voltage supplied is large enough to permit maximum linear output voltage swing for the largest RF signal present at the PA RF input. However, because smaller RF input levels (i.e. lower PA drive levels) require less DC power for the same gain, the PA becomes inefficient at lower drive levels. To improve efficiency at lower drive levels, a dynamic control technique known as "envelope tracking" has been developed. According to this technique, the envelope of the PA RF input signal is tracked and used to regulate the battery voltage into a dynamically variable voltage source. The envelope tracking technique thereby improves PA efficiency. When applied to a conventional linear amplifier this technique tends to degrade linearity, as it varies the bias of the active devices. However, when applied to polar transmitters there is no sacrifice of linear performance, and the desired efficiency improvement is more readily realized.

Accurate envelope tracking requires that the switching frequency of the switchmode DC-DC power converter be about 20 to 50 times higher than the required signal envelope bandwidth. For a signal such as EDGE (Enhanced Data GSM (Global System for Mobile Communications) Environment) this envelope bandwidth is 1 MHz, whereas for UMTS (Universal Mobile Telecommunications System) this envelope bandwidth expands to 10 MHz. For EDGE, this means that the DC-DC power converter must switch at a 20–50 MHz rate. This switching frequency requirement increases to 200–500 MHz for UMTS application. Unfortunately, most DC-DC power converters operate with a switching frequency below 1 MHz, and a 2 MHz switching frequency is considered to be extremely high. To meet this efficiency need, therefore, there is a need to increase the switching frequency of DC-DC converters by a factor of about 20 to 200.

Figure 2:
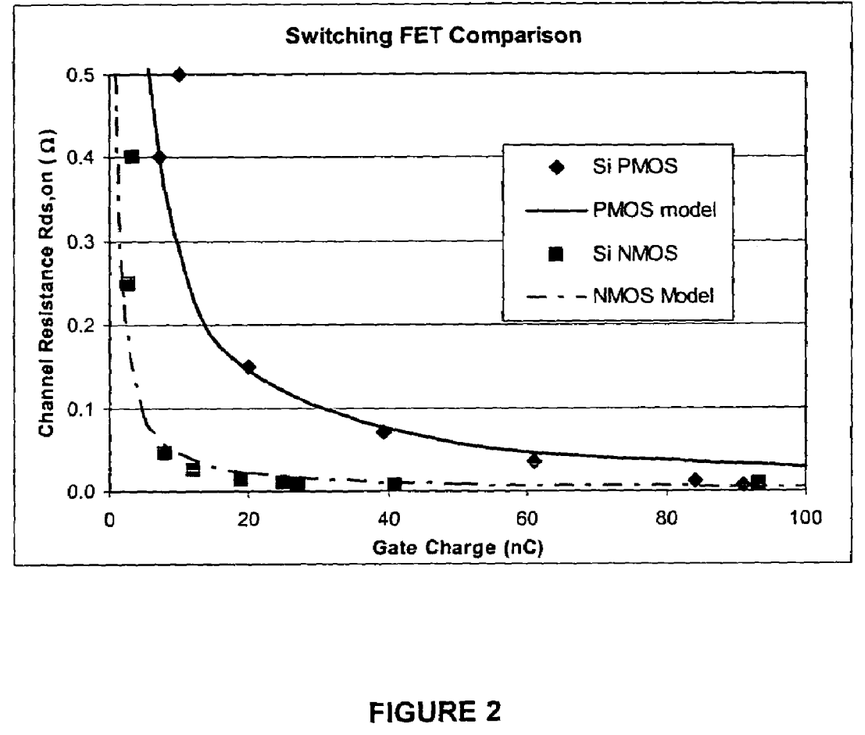
FIG. 2 is a graph illustrating the $\tau_{FET}$ characteristics of various Silicon-based transistor switches of the prior art.

To evaluate the applicability of a variety of transistor types to the high-speed, high-current applications described above, a figure-of-merit (FoM) defined by the product of the transistor switch on-resistance RDSon and the average input capacitance CGS of the transistor (defined as the ratio of the gate-charge QG required to turn on the FET to the gate-source voltage VGS required to set up the controlling electric field, so that here CGS=QG/VGS) may be used. This FoM has units of time and may be expressed as $\tau_{FET}$=RDSon CGS. The validity of this approach is seen in FIG. 2, which plots several combinations of gate-charge and the corresponding channel resistance achieved for Silicon MOSFETs available commercially. The best-fit $\tau_{FET}$ model is drawn among the points as a continuous curve. Different values of $\tau_{FET}$ are needed for the PMOS and NMOS devices, which in this instance are 580 nanoseconds (ns) and 80 ns, respectively. It is also found that different manufacturers have slightly different values of $\tau_{FET}$ for their competitive devices, which demonstrates another intention for this FoM in that it should allow comparison of devices across process types.

Figure 3:
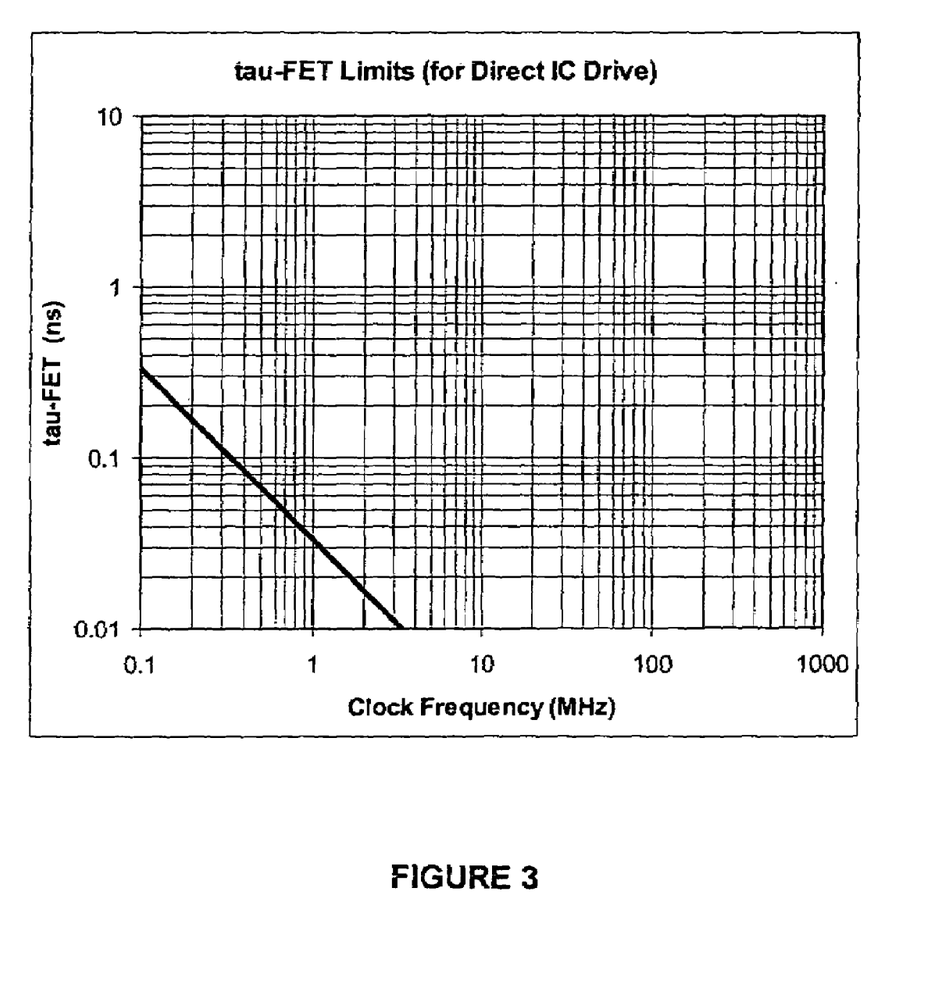
FIG. 3 is a graph illustrating the minimum $\tau_{FET}$ values required for desired operating frequencies with direct drive from a standard CMOS digital integrated circuit.

Since the conducting channel of a FET is controlled by the electric field between the gate and source terminals, the turning ON and OFF of this conducting channel depends on repeatedly moving this gate-charge into and out of the transistor. The value of the gate current required to move this charge depends on the amount of time allowed to move the charge. Clearly, to achieve high operating speed it is strongly desired to have a minimum amount of gate-charge necessary to control the channel. Assuming that no more than 40% of the operating time is spent in switching transitions (a very generous assumption) then it is possible to determine practical maximum values for $\tau_{FET}$, depending on the desired operating frequency $f_{CLK}$. This determination is presented in FIG. 3. Commonly available values of $\tau_{FET}$ for modern Silicon MOSFET switching transistors range between 0.025 and 0.09 ns. As FIG. 3 shows, these values limit the operating frequency of the Silicon MOSFET switching transistor (using CMOS driver circuitry) to under 1 MHz. To exceed this operating frequency it is necessary to use bipolar-based drive circuitry, a technique that is widely used in industry today. This is undesirable from both cost and integration compatibility points of view. It is strongly desired to design using only CMOS technology for cost reasons. Any use of bipolar transistors on a chip forces the use of a more expensive process. For most DC-DC switching converters the power switch transistors are external already, so process compatibility with these huge transistors is not an issue anyway. How to control and drive these huge transistors is an extremely important issue.

An alternative figure of merit, called FET-FOM, can be considered which emphasizes the joint desirability of low switch on-resistance RDSon, low gate-charge (QG), and low gate-source voltage (VGS). This is defined as the product of these three parameters: FET-FOM=RDSon QG VGS. To compare various devices of different technologies, this alternative method has merit in that when gate-charge and gate-source voltage scale down together, the value of $\tau_{FET}$ will not change but the value of FET-FOM will fall on the fact that both parameters are now lower.

To realize the desired efficiency improvements discussed above, the switching transistors of the DC-DC power converter must be capable of switching ampere-scale currents within a small fraction of the period of switching frequency. For example, to use a switching frequency of 100 MHz, the transistors must switch the supply currents ON or OFF in typically under one nanosecond. These requirements demand that the driving circuitry in the controller of the converter be robust enough to translate the low-level CMOS logic outputs of the controller 18 into drive signals capable of driving switching transistors 12 and 14. Due to the large gate capacitances of the switching transistors 12 and 14, however, the required size of the drivers could be prohibitively large and in many instances, irrespective of size, simply unable to transfer the gate charge QG fast enough to switch the switching transistors at the desired speed. This driver problem, in addition to the limits on the achievable $\tau_{FET}$s of Silicon-based switching devices, renders the conventional converter 10 in FIG. 1 of no practical use for many applications including, for instance, use in the envelope tracking wireless device application described above.

There is prior art where GaAs technology is used to build the entire DC-DC converter, including GaAs device technology to drive the switching transistors of the converter. See, G. Hanington, A. Metzger, P. Asbeck and H. Finlay, "Integrated DC-DC Converter having GaAs HBT Technology", *Electronics Letters*, vol. 35, pp. 2110–2112, 1999; M. Ranjan, K. H. Koo, C. Fallesen, G. Hanington and P. Asbeck, "Microwave Power Amplifiers with Digitally-Controlled Power Supply Voltage for High Efficiency and Linearity", 2000 *IEEE MTT-S International Microwave Symposium Digest*, pp. 495, June 2000; S. Ajram, R. Kozlowski, H. Fawaz, D. Vandermoere and G. Salmer, "A fully GaAs-based 100 MHz, 2W DC-to-DC Power Converter", *Proceedings of the 27th European Solid-State Device Research Conference*, Stuttgart, Germany, 22–24 September 1997. However, in addition to these prior art approaches using all-GaAs technology (e.g. GaAs MESFETs and/or HBTs), all of the prior art in which HBTs are employed is applicable to the boost (higher output voltage than input voltage) converter configuration only. That prior art is not applicable to the buck (lower output voltage than input voltage) converter configuration. HBT devices (or other bipolar devices) cannot be used for the shunt element (synchronous rectifier) because current flows in the reverse direction through these types of elements.

In summary, the gate-charge required by Silicon MOSFET transistors is simply too high to achieve the operating frequencies necessary to support EDGE, UMTS and other high-frequency envelope following DC-DC converter applications. It would be desirable, therefore, to find an alternative approach, which can both meet the desired operating frequencies and reduce the costs of driver circuitry by allowing standard CMOS technology to be used.

SUMMARY OF THE INVENTION

Switchmode DC-DC power converters employing one or more non-Silicon-based switching transistors and a Silicon-based (e.g. CMOS) controller are disclosed. The non-Silicon-based switching transistors may comprise, but are not necessarily limited to, III–V compound semiconductor devices such as gallium arsenide (GaAs) metal-semiconductor field effect transistors (MESFETs) or heterostructure FETs such as high electron mobility transistors (HEMTs). According to an embodiment of the invention, the low figure of merit (FoM), $\tau_{FET}$, of the non-Silicon-based switching transistors allows the converters of the present invention to be employed in envelope tracking amplifier circuits of wireless devices designed for high-bandwidth technologies such as, for example, EDGE and UMTS, thereby improving the efficiency and battery saving capabilities of the wireless devices.

Further aspects of the invention are described and claimed below, and a further understanding of the nature and advantages of the inventions may be realized by reference to the remaining portions of the specification and the attached drawings.

DETAILED DESCRIPTION

Figure 4:
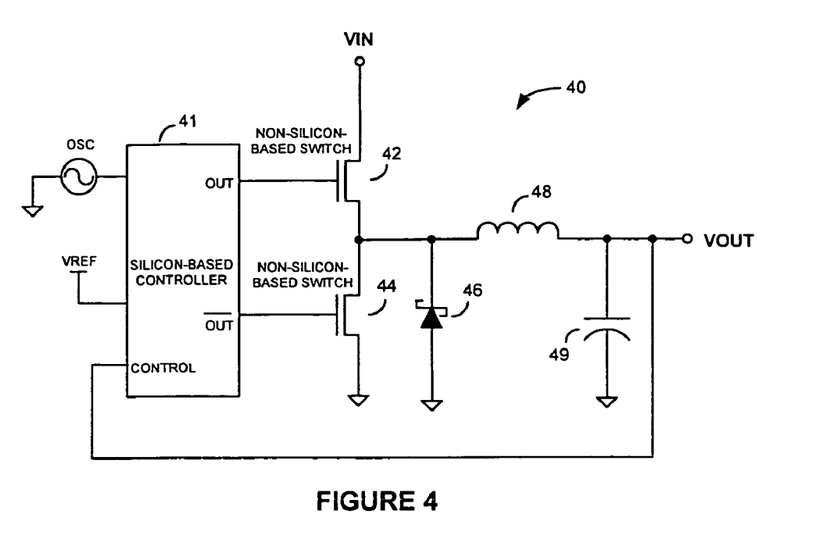
FIG. 4 is a schematic diagram of an exemplary DC-DC power converter, according to an embodiment of the present invention.
Figure 5:
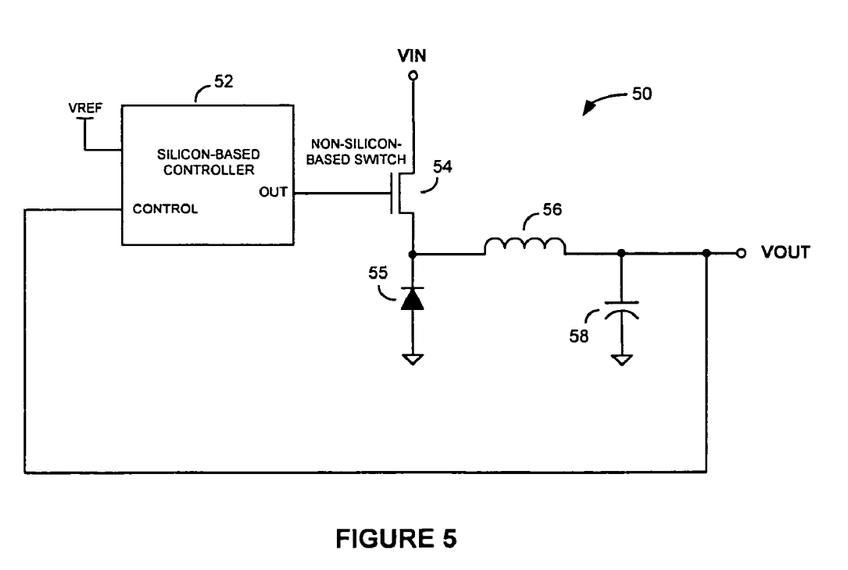
FIG. 5 is a schematic diagram of an alternative exemplary DC-DC power converter, according to an embodiment of the present invention.

Referring to FIG. 4, there is shown a schematic diagram of an exemplary synchronous DC-DC power converter 40, according to an embodiment of the present invention. Converter 40 comprises a Silicon-based (e.g. CMOS) controller 41, non-Silicon-based switching transistors 42 and 44, a Schottky diode 46, an inductor 48, and a capacitor 49. FIG. 5 shows a schematic diagram of an alternative topology of a DC-DC converter 50, according to an alternative embodiment of the present invention. Converter 50 comprises a Silicon-based (e.g. CMOS) controller 52, a non-Silicon-based switching transistor 54, a diode 55, an inductor 56, and a capacitor 58. Unlike prior art power converters (e.g. the power converter 10 in FIG. 1), converters 40 and 50 are capable of following wide-bandwidth envelope variations of wide-bandwidth technologies such as, for example, EDGE and UMTS. Accordingly, as described in more detail below, the power converters of the present invention may be used to, for example, improve the efficiencies and prolong the battery life of wireless devices.

Figure 6:
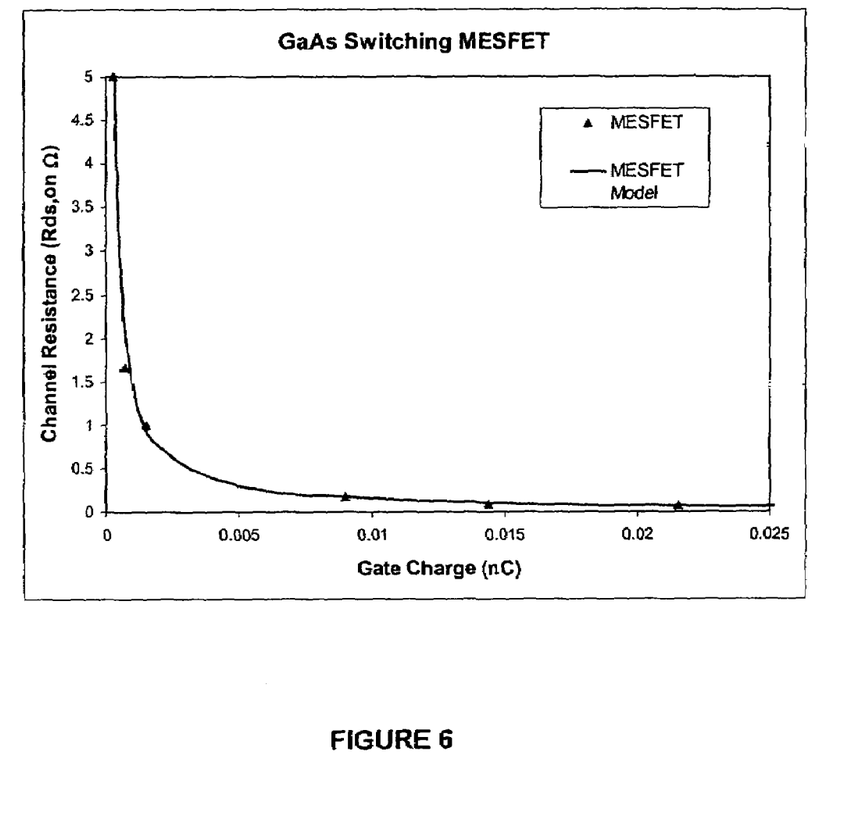
FIG. 6 is a graph illustrating the $\tau_{FET}$ characteristics of a particular exemplary switching transistor type, the GaAs MESFET, which can be used in the DC-DC power converters shown in FIG. 4, FIG. 5, or similar converter.

The ability to achieve the desired efficiencies and operating frequencies described above relates, at least in part, to the inventor's determination that Silicon-based devices lack the necessary FoM, i.e. the $\tau_{FET}$, required to achieve such efficiencies and operating frequencies. FIG. 6 shows the $\tau_{FET}$ characteristics of a GaAs MESFET device, which is a transistor type that may be used for switching transistors 42 and 44 of converter 40 or for switching transistor 54 of converter 50 in the embodiments shown in FIGS. 4 and 5. When the gate of the GaAs MESFET is charged to its final gate-source voltage, the value of $\tau_{FET}$ is approximately 0.0005 nanoseconds (ns). This $\tau_{FET}$ value of the GaAs MESFET and the $\tau_{FET}$ value of a GaAs pseudomorphic high electron mobility transistor (pHEMT) are compared to models of various other Silicon transistor device technologies in FIG. 7A. From FIG. 7A it is seen that the GaAs MESFET has a $\tau_{FET}$ value that is a factor of 160 times better (400 times better for the pHEMT) than the lowest $\tau_{FET}$ achieved by the other Silicon devices. This means that for a particular transistor ON resistance (RDSon) required by the load application, the GaAs MESFET and pHEMT technologies exhibits a lower switch input capacitance and, therefore, require a lower amount of gate charge of the Silicon-based FET technologies evaluated in FIG. 7A. This distinction is further highlighted in FIG. 7B, where the alternative FET-FOM (RDSon QG VGS) is plotted for many instances of switching FETs of multiple technologies. The Silicon-based devices all bunch together at the top, with values above unity. The GaAs MESFET devices have FET-FOM values approximately two orders of magnitude lower, due primarily to this technology's much lower gate-charge requirements compared to Silicon. The GaAs pHEMT devices are yet another two orders of magnitude lower, due to their lower VGS voltages and slightly lower gate-charge. Clearly the GaAs devices are far more desirable than the Silicon-based transistors for this high speed switch application.

GaAs EpHEMT devices have achieved operating frequencies of over 250 MHz. This is two orders of magnitude greater than frequencies considered extremely high for all-Silicon switching transistor designs, placing this approach well beyond evolutionary improvement status of conventional designs. These results are achieved using pHEMT devices that are not specifically designed for this use, so further improvements are expected as the inventions set forth in this disclosure are capitalized upon by industry.

Those skilled in the art will understand that the particular GaAs MESFET and pHEMT devices described above are only exemplary and that other non-Silicon-based device technologies using materials similar to or other than GaAs (e.g. other III/V compound semiconductors, high-temperature superconductors, etc.) may be used, so long as such device technologies are capable of functioning as bi-directional switches and are able to exhibit superior $\tau_{FET}$ and/or gate-charge characteristics compared to the Silicon-based MOSFET switches described in relation to the prior art or similar $\tau_{FET}$ and/or gate-charge characteristics as that of the GaAs MESFET and pHEMT devices described in the context of the various embodiments of the present invention.

Even if Silicon-based transistors could switch currents at the rate required for a particular application (which as described above is not necessarily the case), the driver circuitry required to switch the Silicon transistor would be large and costly, especially where the driver circuitry comprises part of the Silicon-based controller of the converter. The reason for this is that the gate capacitances of Silicon-based MOSFETs are much larger than the gate capacitances of non-Silicon-based devices like the GaAs MESFET and pHEMT switches described above, for example.

When minimum transition time is the dominant performance metric, driver gates are sized to charge/discharge the load capacitance presented by the power switching transistor. Large gate capacitances require smaller driver on-resistances, with correspondingly larger driver devices, to achieve high switch transition speed. Therefore, faster switch operation requires larger driver devices, for the same switching transistor. If the speed requirement is fast enough, the driver devices may actually be no smaller than the actual power switch, and no gain is available to scale up from standard logic drive signals. Clearly this is a limiting case of no value.

Figure 7A:
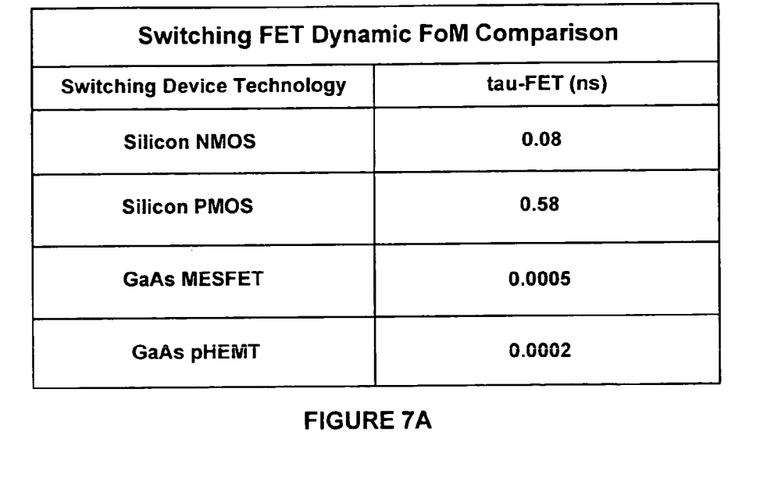
FIG. 7A is a table comparing FoM, i.e. $\tau_{FET}$, values of particular GaAs MESFET and pHEMT transistor switches to the $\tau_{FET}$ values of various Silicon-based transistor switches of the prior art, when the transistors are biased to their final gate-source voltages.
Figure 8:
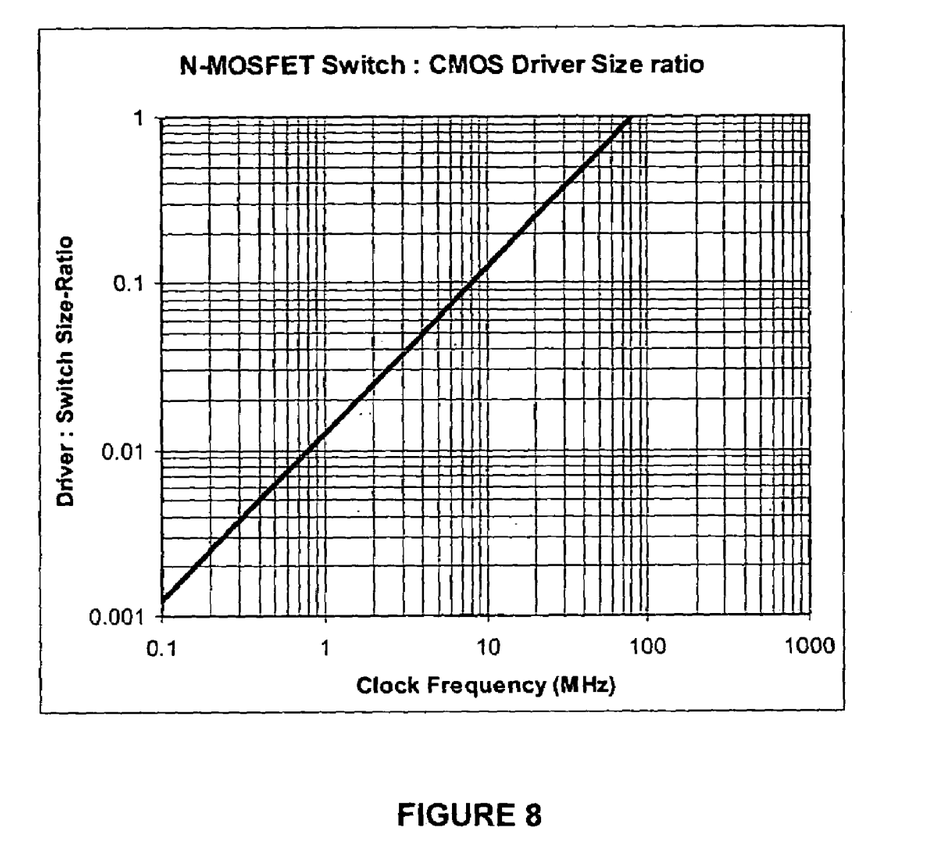
FIG. 8 is a graph showing the ratio of a CMOS driver size to Si NMOS switching transistor size as a function of switching transition time for cascaded CMOS gates made using transistors meeting the $\tau_{FET}$ values shown in FIG. 7A.
Figure 9:
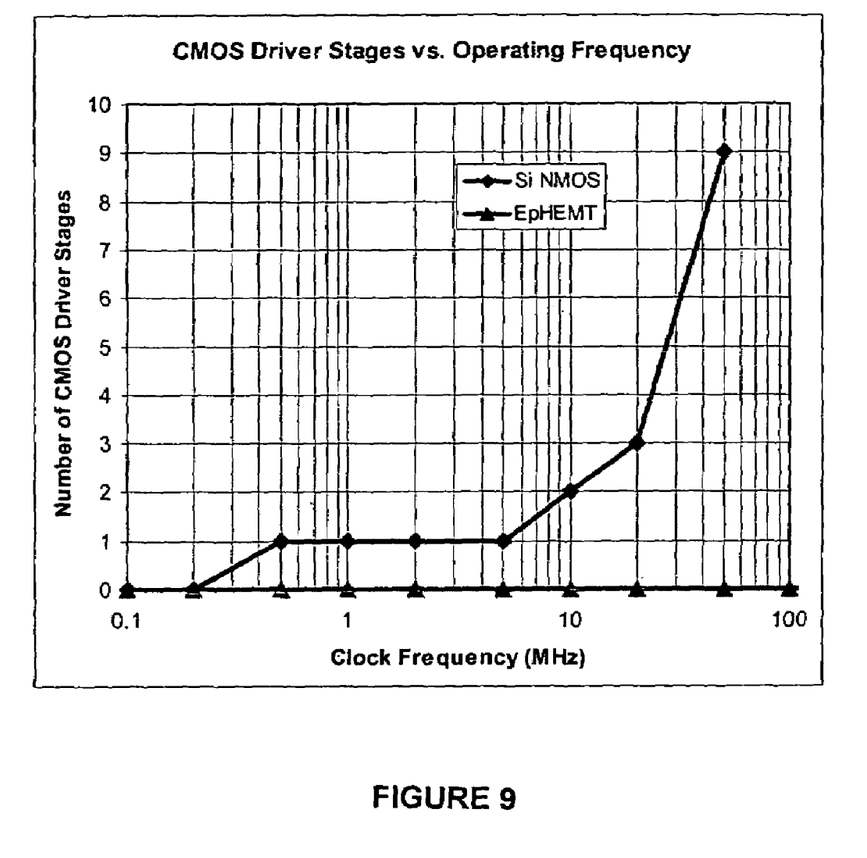
FIG. 9 is a graph relating the number of CMOS driver stages required vs. operating frequency for Si NMOS and GaAs pHEMT switching transistor types.

Consider, as an example, the drive requirements a one ampere switch made using GaAs MESFETs compared to the drive requirements of a switch made from Silicon-based MOSFETs. FIG. 8 shows that for cascaded CMOS gates made using Silicon transistors meeting the FoM shown in FIG. 7A, this unity 'gain' point (where the switch driver transistor is the same size as the switch transistor itself) occurs at about 75 MHz operating frequency. FIG. 9 shows that when a Si NMOS switching transistor is used, the number of driver stages needed to attain this speed increases dramatically as the operating frequency passes above $\frac{1}{10}$ of this limit. (In this example, the power switch has an ON channel resistance of 0.05 ohms, and the driving IC is limited to 30 ohms of drive resistance. These parameters are included not in any way to limit the scope of the inventions disclosed herein, but are included merely as a means of highlighting the difference in drive requirements between Silicon-based switching transistors and non-Si-based switching transistors.) These stages, while increasing in number, also increase in individual size, leading to an increase in controller die size, and ultimately an increase in cost.

Figure 7B:
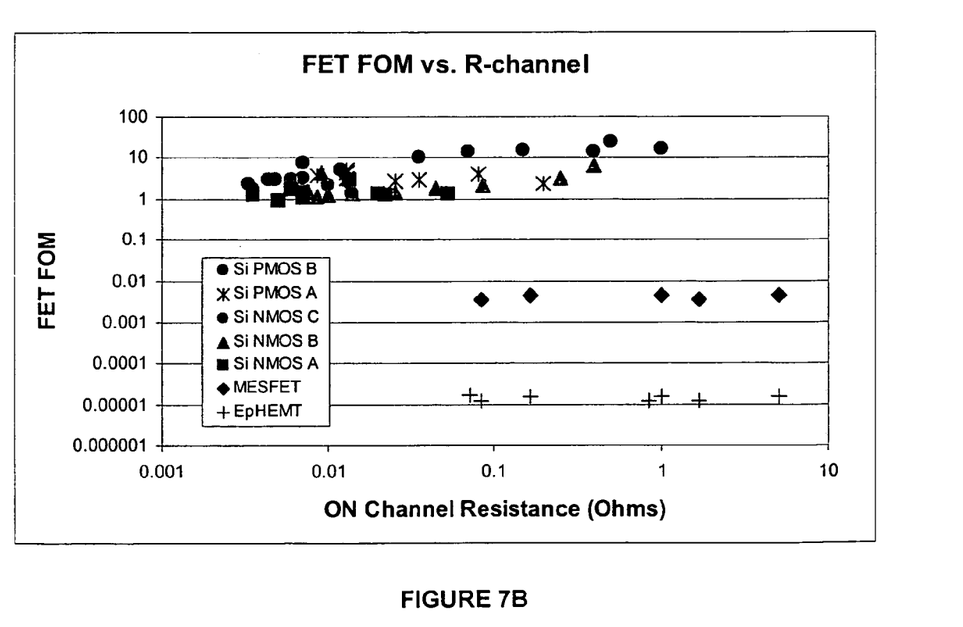
FIG. 7B is a graph comparing multiple transistor technologies using the alternative FET FoM.

The power switch input capacitance is dramatically lower for GaAs MESFET and pHEMT switches than it is for a Silicon-based switches of equivalent current capability. For example, the ratio between Silicon NMOS and GaAs pHEMT input capacitances, found from FIG. 7A, is approximately 0.08:0.0002~400:1. The substantial drop in switch device equivalent input capacitances renders the CMOS driver stages from the CMOS lineup in FIG. 9 no longer necessary. As shown in FIG. 9, the driver lineup for switches made from GaAs pHEMT devices is essentially eliminated. Indeed, when the switching transistor is changed to a GaAs pHEMT device, the CMOS digital controller can readily drive the power switch alone, even at a rate beyond 100 MHz. Accordingly, additional costs and Silicon area are saved by the embodiments of the present invention. Avoiding use of GaAs drive and control technology also saves costs and reduces complexities. The cost of GaAs materials is much higher (on the order of 5–10 times) than for Silicon. If GaAs is to be used, cost issues dictate that a minimum amount of GaAs be allowed. Addressing these cost concerns and other performance demanding concerns, embodiments of the present invention allow only the power switches of the converter to be in a non-Silicon technology. All other circuitry, including driver circuitry, is implemented in Silicon technologies such as, for example, CMOS.

Figure 10:
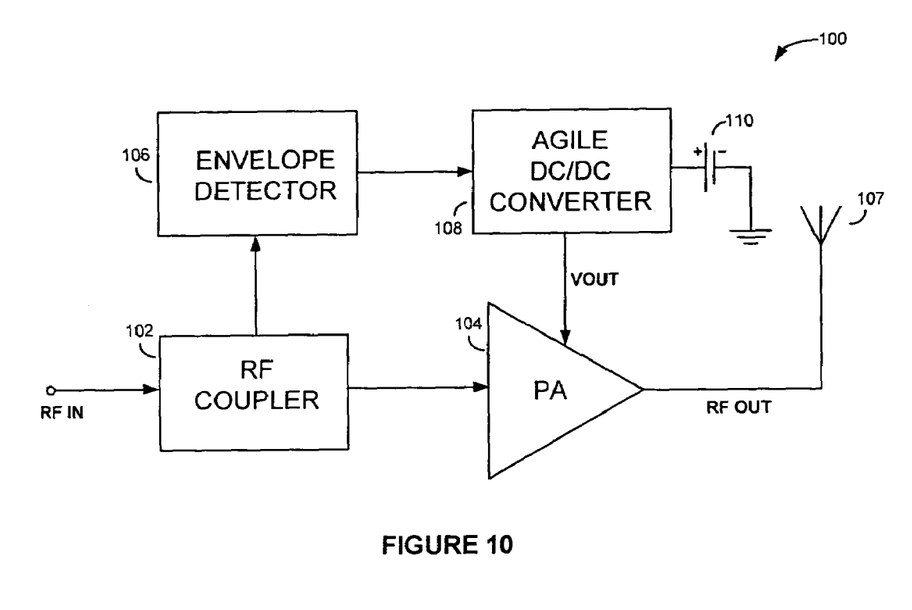
FIG. 10 is a schematic block diagram of an envelope tracking amplifier circuit, which may employ the DC-DC converter shown in FIG. 4, the DC-DC converter shown in FIG. 5, or similar converter, so as to improve the efficiency of a power amplifier of a wireless device, according to an embodiment of the present invention.

According to another embodiment of the invention, either of the DC-DC power converters in FIGS. 4 and 5 (or similar power converter employing non-Silicon-based switching transistors) may be used in an envelope tracking amplifier circuit of a wireless device transmitter to improve the efficiency of the power amplifier (PA) of a radio frequency (RF) transmitter. An envelope tracking amplifier circuit 100 for improving the efficiency of a PA, according to these embodiments, is shown in FIG. 10. An RF input signal is applied to an input port of an RF coupler 102, which operates to direct the RF input signal to an input port of a PA 104 and couple the RF input signal to an input of an envelope detector 106, as is known in the art. PA 104 produces an RF output signal that is radiated by an antenna 107. Envelope detector 106 operates to track the envelope variation of the coupled RF input signal and provide a control signal to a control input of a DC-DC power converter 108, which as mentioned above may comprise either one of the power converters shown in FIGS. 4 or 5 or similar power converter employing non-Silicon-based switching transistors. Based on the envelope variation, the control signal regulates a battery 110 into a dynamically variable voltage that is used to power PA 104. Because non-Silicon-based, low $\tau_{FET}$ devices are used in DC-DC power converter 108, envelope tracking amplifier circuit 100 may be used to improve the efficiency and prolong the battery life of wireless devices that use UMTS, EDGE and other high-bandwidth technologies.

Figure 11:
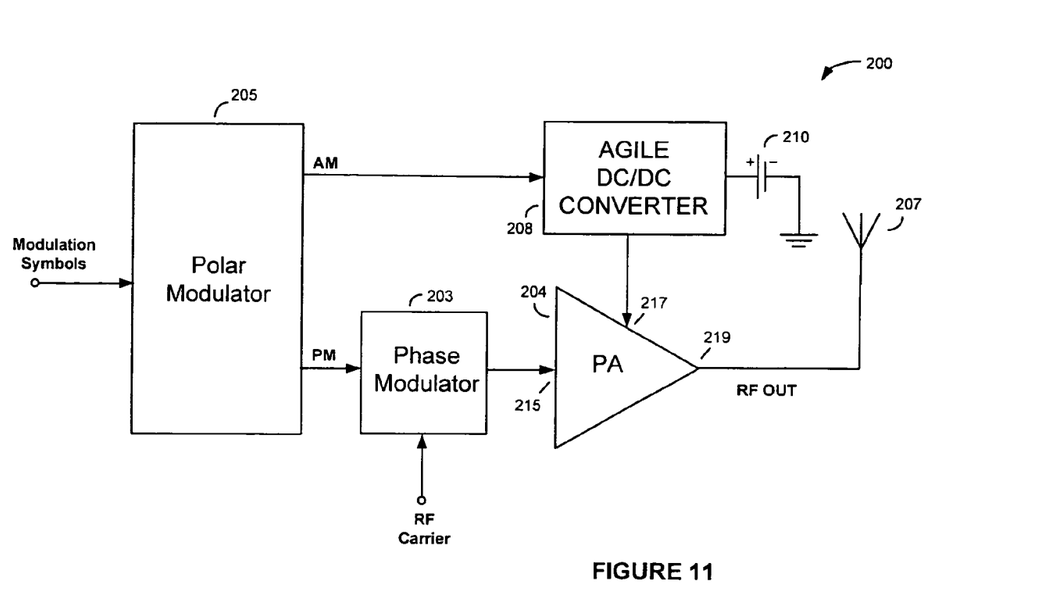
FIG. 11 is a schematic block diagram of a direct polar transmitter circuit, which may employ the DC-DC converter shown in FIG. 4, the DC-DC converter shown in FIG. 5, or similar converter, so as to improve the efficiency of a power amplifier of a wireless device, according to an embodiment of the present invention.

According to another embodiment of the invention, either of the DC-DC power converters in FIGS. 4 and 5 (or similar power converter employing non-Silicon-based switching transistors) may be used in a polar envelope modulator circuit of a wireless device transmitter to improve the efficiency of the PA of the transmitter. A polar transmitter circuit 200 for using an RF power generation stage (e.g. a PA) in its most efficient manner, being fully compressed, according to these embodiments, is shown in FIG. 11. RF power generation stage 204 is a three port device comprising two input ports and one output port. A first input port 215 is configured to receive an RF carrier signal with all angle modulation (if any). A second input port 217 is configured to receive an envelope control signal from DC-DC converter 208. Modulation symbols are applied to an input port of a polar modulator 205, which operates to convert the modulation symbols into their corresponding phase modulation (PM) and amplitude modulation (AM) components. The AM component is applied as a control signal to a control input of a DC-DC power converter 208, which as mentioned above may comprise either one of the power converters shown in FIGS. 4 or 5 or similar power converter employing non-Silicon-based switching transistors. RF power generation stage 204 produces an RF output signal at RF output port 219, which is then radiated by an antenna 207. Based on the amplitude modulation signal received from polar modulator 205, the DC-DC converter 208 regulates a battery 210 into a dynamically variable voltage that is used to power RF power generation stage 204. Because non-Silicon-based, low $\tau_{FET}$ devices are used in DC-DC power converter 208, polar transmitter circuit 200 may be used to provide long battery life for wireless devices that use UMTS, EDGE and other high-bandwidth technologies.

Figure 12:
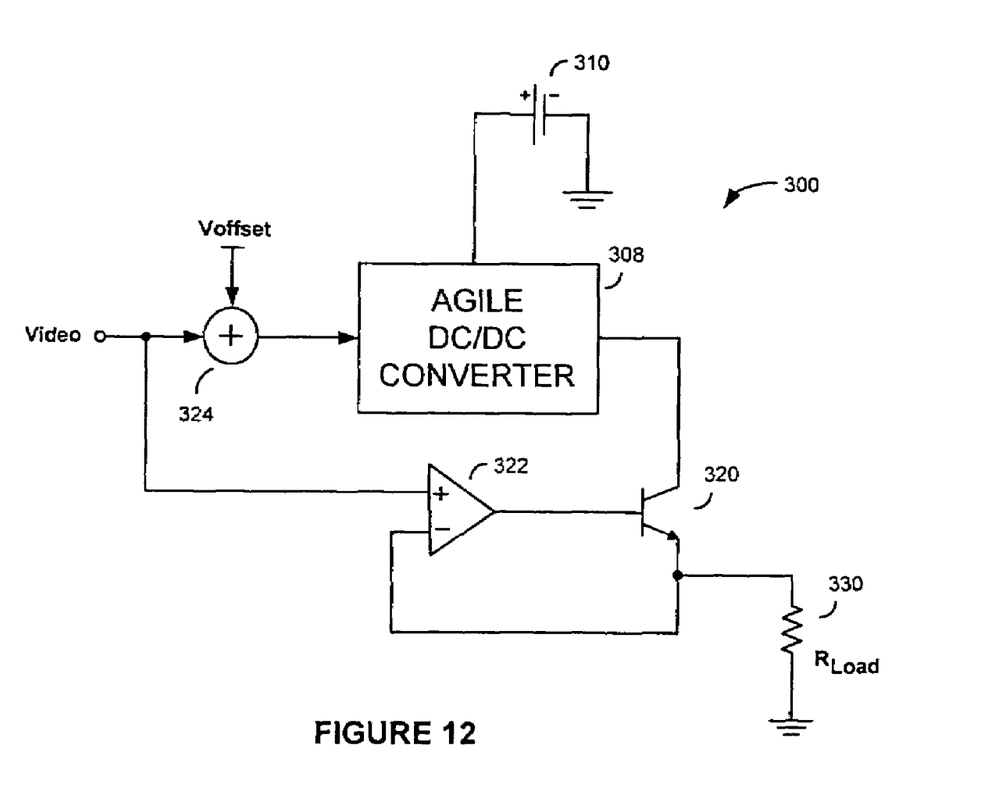
FIG. 12 is a schematic block diagram of a high efficiency video amplifier/driver circuit, which may employ the DC-DC converter shown in FIG. 4, the DC-DC converter shown in FIG. 5, or similar converter, according to an embodiment of the present invention.

According to yet another embodiment of the invention, either of the DC-DC power converters in FIGS. 4 and 5 (or similar power converter employing non-Silicon-based switching transistors) may be used as a video driving amplifier to provide unusually high efficiency in such a broadband driver. A video amplifier/driver circuit 300 for providing high efficiency, according to these embodiments, is shown in FIG. 12. A video input signal is applied to both a non-inverting input port of an operational amplifier 322 and a voltage summer 324. An offset voltage is added to the video signal by the voltage summer 324, which provides a control signal to a control input of a DC-DC power converter 308, which as mentioned above may comprise either one of the power converters shown in FIGS. 4 or 5 or similar power converter employing non-Silicon-based switching transistors. Based on the offset video signal, the control signal regulates a battery 310 into a dynamically variable voltage that is applied to pass transistor 320. The output terminal of pass transistor 320 is applied to the video load 330, shown in FIG. 12 as a resistor. The signal on the output terminal of pass transistor 320 is also fed back to the inverting input of operational amplifier 322. The output of operational amplifier 322 is connected to the control terminal of pass transistor 320. Because non-Silicon-based, low $\tau_{FET}$ devices are used in DC-DC power converter 108, envelope tracking amplifier circuit 100 may be used to improve the efficiency of video driving amplifiers, thereby reducing the heat they dissipate.

Whereas the above is a complete description of the preferred embodiments of the invention, various alternatives, modifications, and equivalents may be used. Therefore, the above description should not be taken as limiting the scope of the invention as it is defined by the appended claims.

What is claimed is:

1. A polar transmitter circuit comprising:
   An RF power generation stage having a first and a second input ports and an output port, the first input port 215 is configured to receive an angle modulated signal and the second input port configured to receive an envelope control signal;
   a DC-DC converter having an input and operable to produce the envelope control signal, the converter comprising:
      a first non-Silicon-based switching transistor having a drain configured to connect to a DC input voltage, a source and a gate;
      a Silicon-based controller having an output coupled to the gate of the first non-Silicon-based switching transistor; and
      an inductor having a first end coupled to the source of the first non-Silicon-based switching transistor and a second end embodying an output of the converter;
   a polar modulator, which operable to convert input modulation symbols into corresponding phase modulation (PM) component on a PM line and an amplitude modulation (AM) component on an AM line; and
   the AM line coupled to the input of the DC-DC power converter.

\* \* \* \* \*